United States Patent [19]

Tachiki et al.

[11] 4,302,268

[45] Nov. 24, 1981

[54] PROCESS FOR PREPARING FLEXIBLE PRINTED-CIRCUIT BOARD

[75] Inventors: Shigeo Tachiki; Toshiaki Ishimaru; Nobuyuki Hayashi, all of Hitachi, Japan

[73] Assignee: Hitachi Chemical Company, Ltd., Tokyo, Japan

[21] Appl. No.: 151,986

[22] Filed: May 21, 1980

[30] Foreign Application Priority Data

Jun. 26, 1979 [JP] Japan .................................. 54/81215

[51] Int. Cl.³ ........................ B32B 31/00; B44C 1/22; C23F 1/02
[52] U.S. Cl. ..................................... 156/238; 156/249; 156/634; 156/660; 156/902; 430/319; 430/328
[58] Field of Search ................................ 156/629–634, 156/656, 901, 902, 659.1, 660, 661.1, 235, 238, 247, 249, 285, 286; 427/96; 430/311–319, 126, 328, 260, 263

[56] References Cited

U.S. PATENT DOCUMENTS 4,127,436 11/1978 Friel ................................ 156/285 X

*Primary Examiner*—William A. Powell
*Attorney, Agent, or Firm*—Craig and Antonelli

[57] ABSTRACT

A flexible printed-circuit board is covered imagewise with a polymer film as a cover layer to improve the flexibility of the board. The cover layer is formed by laminating a photoprintable, photosensitive layer supported on a flexible support to the surface of a flexible printed-circuit board, exposing the photosensitive layer imagewise to light to form a polymer image in the layer and removing the unexposed areas of the layer to leave an imaged polymer film on the surface of the board. The formation of the cover layer can be easily conducted by a continuous operation.

3 Claims, No Drawings

PROCESS FOR PREPARING FLEXIBLE PRINTED-CIRCUIT BOARD

BACKGROUND OF THE INVENTION

The present invention relates to a process for preparing a flexible printed-circuit board, and more particularly to a process for preparing a flexible printed-circuit board covered patternwise with a polymer film.

In recent years, the demand for the flexible printed-circuit board is increasing in a wide range of electric and electronic machines for industrial and household uses. The reason is that because of an excellent flexibility and light weight, the flexible printed-circuit board provides many advantages such as decrease of weight and volume and increase of freeness of spacial wiring, in electric and electronic machines which are subject to spacial restriction in designing electric wiring.

The flexible printed-circuit board is prepared by etching or plating treatment in the same manner as the preparation of usual rigid printed-circuit board. However, the flexible printed-circuit board has the advantage that in its preparation these treatments can be continuously conducted, differing from the rigid printed-circuit board. That is to say, the preparation of the flexible printed-circuit board can be made by a roll to roll operation, but not a piece by piece operation as in the case of the rigid printed-circuit board where the board is treated in the form of discrete sheet, since the flexibility is maintained throughout the preparation from a copper clad film which is the starting material to the end product. The possibility of the continuous preparation largely contributes to the reduction of the cost of printed-circuit board. The second peculiar point to the flexible printed-circuit board which is different from the rigid printed-circuit board is that after forming a conductor pattern in a conductor layer by etching or plating treatment, the surface is patternwise covered with a polymer film as a cover layer, in other words, the whole surface excepting the desired portions containing the portions to which electronic components are connected later in the conductor pattern is covered with a polymer film, in order to improve the flexibility which is the most important characteristic of the flexible printed-circuit board. A polyester film and a polyimide film are usually employed as the polymer film for covering. Breaking of the conductor pattern due to folding is remarkably decreased by providing the cover layer as compared with the case of providing no cover layer. It is considered that the effect of improving the flexibility produced by providing the cover layer is much based on the lowering of the angle or curvature of folding of the conductor pattern itself at the time of folding. Therefore, it is of course desirable that the cover layer is as thick as possible, so far as the merit of being light weight of the flexible printed-circuit board is not contrary to other properties. Although the covering with a polymer film also has the secondary effects of securing the electric insulation of the conductor pattern and of protecting the surface from corrosion as the case of the rigid printed-circuit board, the main purpose of providing the cover layer resides in improving the flexibility.

Hitherto, it has been a common practice to provide the cover layer by laminating a polymer film such as a polyester or polyimide film from which the desired portions as mentioned above is previously removed by means of punching, onto the surface of a flexible printed-circuit board with an adhesive. However, in this laminating process, it is very difficult or troublesome to laminate the film to the surface of the board at an exact position thereof, and in case of a flexible printed-circuit board of high density and high accuracy, the lamination has been impossible. Also, since it is more difficult to continuously conduct the positioning, the lamination has had to be conducted in the form of discrete sheet and the roll to roll process which is the merit on the production cost of the flexible printed-circuit board, has not been adopted.

In recent years, in order to solve such problems, there has been proposed a process in which a polymer in the form of ink is applied imagewise to the surface of the board by a screen process printing and is then set. However, this process is still insufficient for the preparation of the flexible printed-circuit board of high density and high accuracy, and also must be done using a discrete board. Moreover, it is essentially difficult to apply the ink in thick onto the pattern projected of the board, since this process is a printing of an ink having a flowability onto the patterned surface. Therefore, the primary purpose of improving the flexibility, i.e. the folding endurance, cannot be sufficiently attained.

It is an object of the present invention to provide a process for preparing a flexible printed-circuit board.

A further object of the invention is to provide a process for easily preparing a high density, high accuracy flexible printed-circuit board having an excellent flexibility.

These and other objects of the invention will become apparent from the description hereinafter.

SUMMARY OF THE INVENTION

In accordance with the present invention, there is provided a process for preparing a flexible printed-circuit board which comprises the steps of:

(1) laminating a photoprintable, photosensitive layer which is supported on a polymer film support, to the surface of a flexible printed-circuit board with a conductor pattern, (2) exposing the photoprintable, photosensitive layer imagewise to light either before or after removing the support from the layer, (3) removing the unexposed areas of the photoprintable, photosensitive layer to leave an imaged polymer film as a cover layer on the surface of the flexible printed-circuit board.

DETAILED DESCRIPTION

In the process of the present invention, there are usable any photoprintable, photosensitive polymer films composed of a film support such as a flexible transparent polyethylene terephthalate film and a layer of a photoprintable, photosensitive resin composition supported on the film support. It is preferred to employ a photoprintable, photosensitive polymer film provided with a protective film on the photosensitive layer, namely on the reverse side of the support so as to sandwich the photosensitive layer.

The term "photoprintable, photosensitive resin composition" as used herein means a composition capable of forming a polymer image by imagewise exposure to light followed by development, and the solubility in a solvent or the adhesive property of the composition is selectively changeable by the imagewise exposure. The development of a latent image formed in the photosensitive layer by the imagewise exposure to light can be attained by means of dissolution in a solvent of the unexposed areas in case of a composition which undergoes a change in solubility by the imagewise exposure, or by means of selective separation of the photosensitive layer upon removing the support after exposing to light in case of a composition which undergoes a change in adhesive property by the imagewise exposure. For instance, the photoprintable, photosensitive polymer films and the photoprintable, photosensitive resin compositions as disclosed in Japanese Patent Unexamined Publication Nos. 107333/1974, 144431/1975 and 20820/1977 may be employed in the present invention.

The lamination of a photoprintable, photosensitive polymer film is conducted by sticking the photoprintable, photosensitive composition layer supported on a support film to the surface of a flexible printed-circuit board with heat and pressure. In case of employing the photosensitive polymer film having a protective film, the lamination is conducted after removing the protective film. When the conductor pattern of the flexible printed-circuit board is thick or is of high density, it is preferable to conduct the lamination under reduced pressure, since voids (air bubbles) apt to be left between the photosensitive polymer film and the surface of the flexible printed-circuit board can be eliminated. Unlike the conventional laminating process using a punched film, the lamination with heat and pressure according to the present invention is very easy, since there is no necessity for conducting accurate positioning. Furthermore, the lamination can be conducted by a roll to roll operation, i.e. a continuous operation. Such a continuous lamination may be carried out by using a usual laminater, e.g. a laminater (commercial name "Model 260" made by Thiokol Dynachem Corp.) and a vacuum laminater (commercial name "VLM-2" made by Hitachi Condenser Kabushiki Kaisha).

The photoprintable, photosensitive layer is exposed to light through a negative mask pervious to light through only the desired portions so as to harden and insolubilize the exposed areas in a developing solution or to change the adhesive property of the exposed areas, either before or after removing the support from the layer, and thereby the latent polymer image is formed in the photosensitive layer. In general in case that the support is an opaque film, it is removed before exposing the photosensitive layer to light, and in case that the support is transparent or the photosensitive layer is the type of changing its adhesive property, the support is removed after exposing the photosensitive layer. The development of the latent image is conducted by dissolving the unexposed areas in a developing solution or by peeling the support film, so the polymer film is selectively left as a cover layer on only the desired portions of the flexible printed-circuit board. The thus obtained cover layer may be further subjected to a heating treatment or a lightexposing treatment in order to increase the strength of the layer.

The thickness of the photosensitive layer of the photoprintable, photosensitive polymer film employed in the present invention varies depending on the thickness and density of the conductor pattern of the flexible printed-circuit board. It is usually selected from 15 to 120 μm.

According to the process of the present invention, it is possible to conduct lamination and exposure to light of a photosensitive layer, removal of a support, development, and post-treatments such as post-exposure, heating, mark printing and pretinning by a roll to roll operation.

The present invention is more particularly described and explained by means of the following Examples, in which all parts are by weight unless otherwise stated.

EXAMPLE 1

A layer having a thickness of 80 μm. of a photosensitive composition consisting of 80 parts of a butyl acrylate-methyl methacrylate copolymer (60:40 by weight), 20 parts of polyethylene glycol (1,000) diacrylate (commercially available under the registered trademark "NK Ester A-23G" made by Shin Nakamura Kagaka Kabushiki Kaisha) and 5 parts of benzophenone, which was supported on a polyethylene terephthalate film having a thickness of 25 μm. (commercially available under the registered trademark "Lumirror" made by Toray Industries, Inc.), was continuously laminated onto a printed-circuit board formed through an etching treatment from a flexible copper clad laminate (commercial name "MCF-11" made by Hitachi Chemical Company, Ltd.), at a laminating temperature of 100° C. and at a laminating speed of 1 m./minute under reduced pressure by employing a vacuum laminater (commercial name "VLM-2" made by Hitachi Condenser Kabushiki Kaisha).

The photosensitive layer was exposed through a negative mask to light of an ultra-high pressure mercury lamp (made by Kabushiki Kaisha Ohku Seisakusho) for 90 seconds. After removing the film support, development of an image was then carried out for 120 seconds by employing 1,1,1-trichloroethane. The obtained image was further exposed to the light of the ultra-high pressure mercury lamp for 3 minutes.

The thus prepared flexible printed-circuit board having a precise polymer film as a cover layer on its surface had an excellent flexibility. By the M.I.T. folding test (load 0.5 kg., 2R), it was observed that the number of foldings till breaking of copper pattern (width of copper line: 1 mm.) was 120 and the folding endurance was remarkably increased as compared with the flexible printed-circuit board having no cover layer on which the number of foldings was 95.

EXAMPLE 2

A layer having a thickness of 100 μm. of a photosensitive composition consisting of 60 parts of a polyester resin (excess hydroxyl group to carboxyl group: 10% by weight) prepared from ethylene glycol and phthalic acid, 40 parts of the polyethylene glycol diacrylate "NK Ester A-23G" and 10 parts of tetrabutyl titanate, which was supported on a polyethylene terephthalate film having a thickness of 25 μm., was continuously laminated onto a printed-circuit board obtained by using the flexible copper clad laminate "MCF-11" at a laminating temperature of 120° C. and at a laminating speed of 1.5 m./minute. After conducting the exposure and the development in the same manner as in Example 1, heat treatment was then conducted in an oven at 180° C. for 30 minute.

The thus prepared flexible printed-circuit board having a precise polymer film had an excellent flexibility.

What we claim is:

1. A process for preparing a flexible printed-circuit board which comprises the steps of:
   (1) laminating a photoprintable, photosensitive layer which is supported on a polymer film support, to the surface of a flexible printed-circuit board with a conductor pattern, (2) exposing the photoprintable, photosensitive layer imagewise to light either before or after removing the support from the layer, (3) removing the unexposed areas of the photoprintable, photosensitive layer to leave an imaged polymer film as a cover layer on the surface of the flexible printed-circuit board.

2. A process according to claim 1, wherein the photosensitive layer has a thickness that varies from 15 to 120 $\mu$m.

3. A process according to claim 1, wherein lamination of the photoprintable photosensitive layer supported on a polymer film support is effected by a roll to roll operation in a continuous manner to provide the cover layer which protects and increases the flexibility of the flexible printed-circuit board.

* * * * *